United States Patent [19]  
Sowell et al.

[11] Patent Number: 4,820,939  
[45] Date of Patent: Apr. 11, 1989

[54] FINITE METASTABLE TIME SYNCHRONIZER

[75] Inventors: Richard G. Sowell, San Jose; Robert Pieters, Eldorado, both of Calif.

[73] Assignee: National Semiconductor Corporation, Santa Clara, Calif.

[21] Appl. No.: 124,875

[22] Filed: Nov. 24, 1987

[51] Int. Cl.$^4$ .................. H03K 5/13; H03K 19/00
[52] U.S. Cl. .................. 307/269; 307/272.2; 307/480; 307/279; 328/63; 377/117; 377/79
[58] Field of Search .................. 307/272.2, 291, 290, 307/269, 480, 279, 443; 328/63, 72; 377/79, 78, 116, 115, 117

[56] References Cited

U.S. PATENT DOCUMENTS

| 4,093,878 | 6/1978 | Paschal et al. | 307/291 |
| 4,398,105 | 8/1983 | Keller | 307/518 |
| 4,498,176 | 2/1985 | Wagner | 307/269 X |
| 4,529,892 | 7/1985 | Reilly et al. | 307/361 |
| 4,591,737 | 5/1986 | Campbell | 307/272.2 |
| 4,667,339 | 5/1987 | Tubbs et al. | 307/272.2 X |
| 4,703,200 | 10/1987 | Zangara | 307/279 |

FOREIGN PATENT DOCUMENTS 2174856 11/1986 United Kingdom ............. 307/272.2

OTHER PUBLICATIONS

Chaney et al., "Beware the Synchronizer", Compcon 72, 1972, pp. 317–319.
Pechoucek, "Anamolous Response Times of Input Synchronizers", IEEE Transactions on Computers, Feb. 1976, pp. 133–139.
Rosenberger et al., "Flip-Flop Resolving Time Test Circuit", IEEE Journal of Solid-State Circuits, vol. SC-17, No. 4, Aug. 1982, pp. 731–738.

Primary Examiner—Stanley D. Miller  
Assistant Examiner—Timothy P. Callahan  
Attorney, Agent, or Firm—Limbach, Limbach & Sutton

[57] ABSTRACT

A synchronizer circuit having a predictable and finite metastable time, and thereby a finite sample interval, resulting in the minimization of the probability of errors in asynchronous information transfer.

5 Claims, 2 Drawing Sheets

FINITE METASTABLE TIME SYNCHRONIZER

BACKGROUND OF THE INVENTION

1. Field of the Invention

The present invention relates to data transfer systems and, in particular, to a synchronization circuit having a finite metastable state for minimizing errors in asynchronous data transfer.

2. Discussion of the Prior Art

Computer systems are subject to significant rates of system failure that result from unreliable interactions between asynchronous subsystems. For example, when communication occurs between two subsystems, it is virtually impossible to eliminate signals that are not logically defined. These signals are often referred to as "runt" or "split" pulses.

As shown in FIG. 1, in conventional digital systems, the incoming data signal to a receiving logic circuit is typically first provided to a synchronizer circuit which usually consists of a D or RS flip-flop. The synchronizer circuit, which is driven at the clock frequency of the receiving logic circuit, converts the asynchronous incoming signal to a signal which is synchronous with the receiving circuit.

It is well known that there exists a trigger pulse that causes a conventional flip-flop to go into a metastable region. For example, referring to FIGS. 1 and 2, the synchronizer circuit shown in FIG. 1 will latch an asynchronous data signal arriving at the input pad of a digital logic circuit at whatever the data level is at the clock sampling time. Since the data signal can change at any time relative to the clock sampling frequency, the synchronizer output can provide a "quasi" level signal which is somewhere between 0 and 1. This quasi level signal will result in violation of the logic function of the digital circuit, causing the associated system to crash.

This "metastable" value between logic levels 0 and 1 is indeterminate in the time domain. Therefore, although it will resolve itself over time, there is no fixed time interval sufficiently long to insure that the flip-flop, with probability 1, will reach a defined output state.

The above-described metastable condition is discussed in greater detail by Chaney et al, "Beware The Synchronizer", Compcon 72, 1972, pp. 317-319.

Techniques for measuring the time required for the flip-flop output to settle out, i.e., to reach one of the two stable states, are described by Pechoucek, "Anomalous Response Times of Input Synchronizers", *IEEE Transactions on Computers*, February 1976, pp. 133-139 and by Rosenberger et al, "Flip-flop Resolving Time Test Circuit", *IEEE Journal of Solid-State Circuits*, Vol. SC-17, No. 4, August 1982, pp. 731-738.

Examples of approaches taken toward a solution to the above-described problem are provided by U.S. Pat. Nos. 4,093,878 issued to Paschal et al on June 6, 1978; 4,398,105 issued to Keller on Aug. 9, 1983; and 4,529,892 issued to Reilly et al on July 6, 1985.

However, none of the above-identified patents discloses a simple, two-stage synchronizer design which relies upon the mutual exclusiveness of the potential metastable solutions of two stages to resolve the metastable state of the synchronizer.

SUMMARY OF THE INVENTION

The present invention provides a synchronizer circuit which achieves a finite metastable time, resulting in a predictable minimum clock period that minimizes asynchronous data transfer anomalies.

A finite metastable time synchronizer, in accordance with the present invention, includes a master stage which receives a buffered input data signal and has the capability of providing two potential metastable points. A slave stage, having the capability of one metastable point, is coupled to the master stage via a data path which also serves as a feedforward/back path to provide resolution of metastable conditions in the synchronizer. The basis for the metastable resolution is the fact that the master and slave stages have mutually exclusive potential metastable points. Since the metastable condition can be resolved in a statistically measurable, finite time, a clock frequency can be determined to guarantee, with a high probability that the logic function of the receiving digital circuit will not be violated.

These and other objects and advantages of the present invention will become apparent and be appreciated by referring to the following detailed description of the invention which should be considered in conjunction with the accompanying drawings.

DESCRIPTION OF A PREFERRED EMBODIMENT

Figure 1:
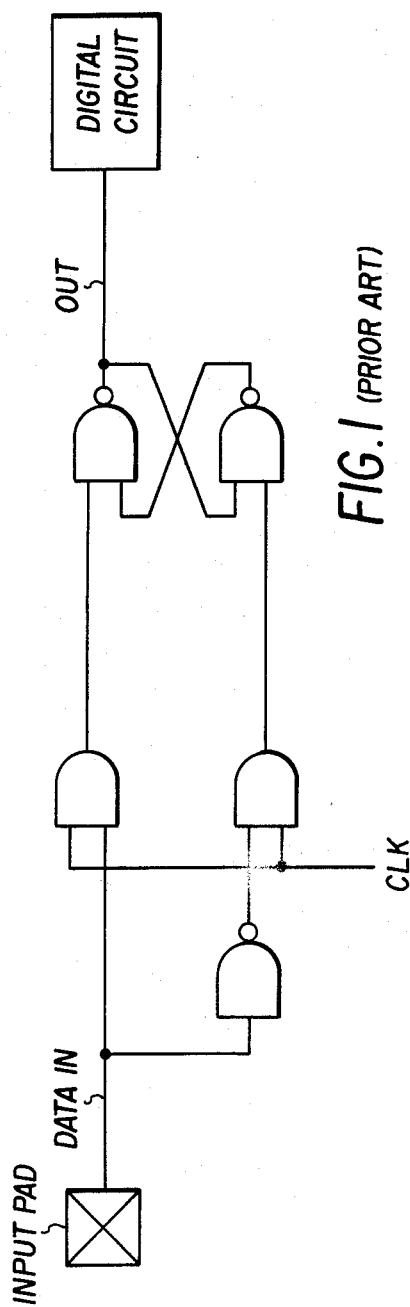
FIG. 1 is a schematic diagram illustrating a conventional synchronizer circuit.
Figure 2:
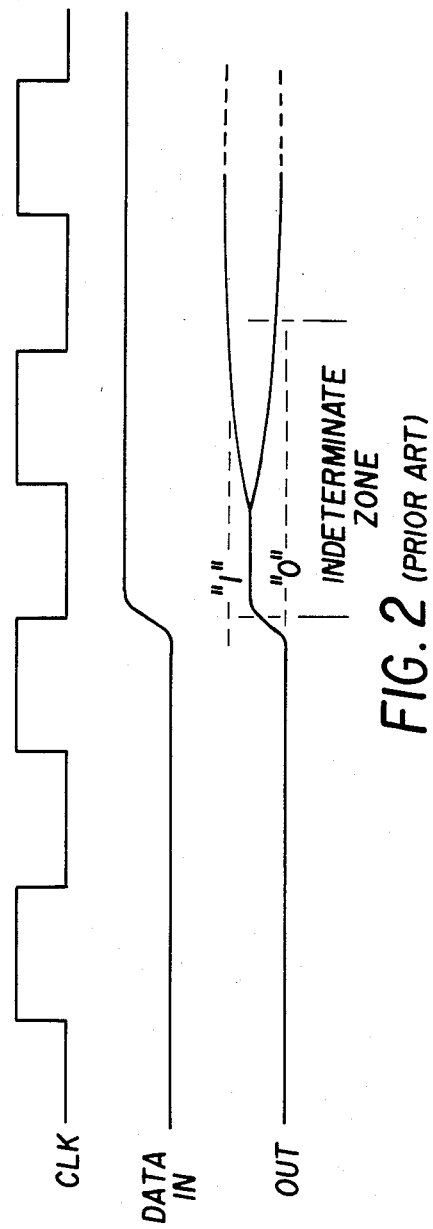
FIG. 2 is a timing diagram illustrating the occurrence of a metastable state in the output of a conventional synchronizer circuit.
Figure 3:
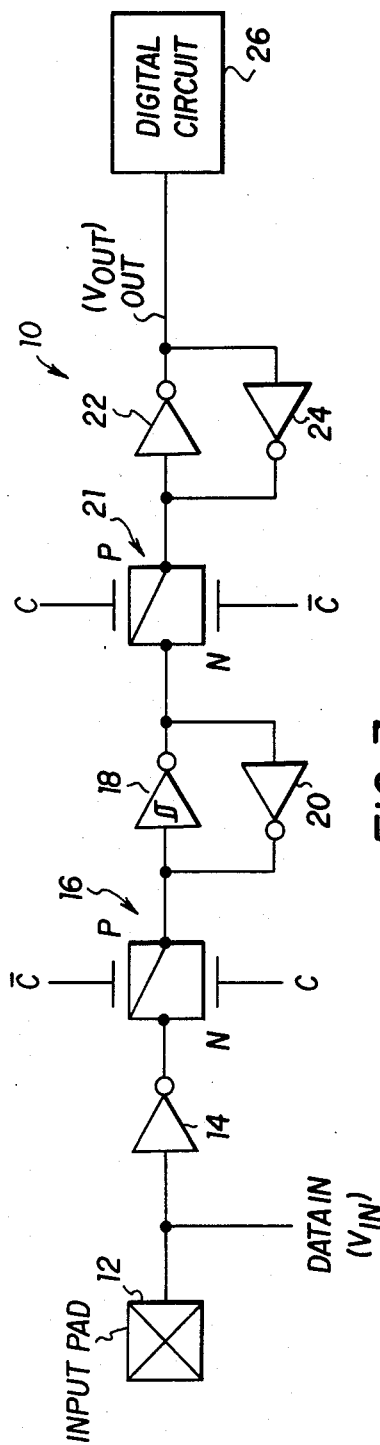
FIG. 3 is a schematic diagram illustrating a finite metastable time synchronizer circuit in accordance with the present invention.

FIG. 3 illustrates a CMOS finite metastable time synchronizer circuit 10 in accordance with the present invention. An input pad 12 provides a digital data input signal to an input inverter 14 which buffers the input signal to provide a known drive to the synchronizer circuit 10. The buffered asynchronous input data signal is then clocked into the synchronizer circuit 10 at the clock C time of the receiving digital circuit; this shall be referred to as the sampling phase of the synchronizer 10. The data signal clocked in by the logic gate 16 is provided to a Schmitt trigger 18 which, in conjunction with a cross-coupled inverter 20, forms a first, master stage of the synchronizer 10. The output of the master stage is provided to a second, slave stage through a second logic gate 21 which transfers feed forward/back data at the compliment of the clock C time; this shall be referred to as the resolution phase of the synchronizer 10.

The second slave stage of the synchronizer 10 is formed by an output inverter 22 and its associated cross-coupled inverter 24. The output inverter 22 serves as a buffer to the receiving digital circuit 26 and also preserves the input drive of the cross-coupled inverter 24 of the slave stage. The cross-coupled inverter 24 of the slave stage is used as feedback for the slave configuration to latch the output voltage to the digital circuit 26. Inverter 24 also provides a finite amount of drive to resolve metastable conditions between the slave stage and the master stage. That is, as described below, the potential metastable points of the master stage do not equal the potential metastable point of the slave stage, the trip level of each stage being defined as $V_{in}=V_{out}$.

Figure 4:
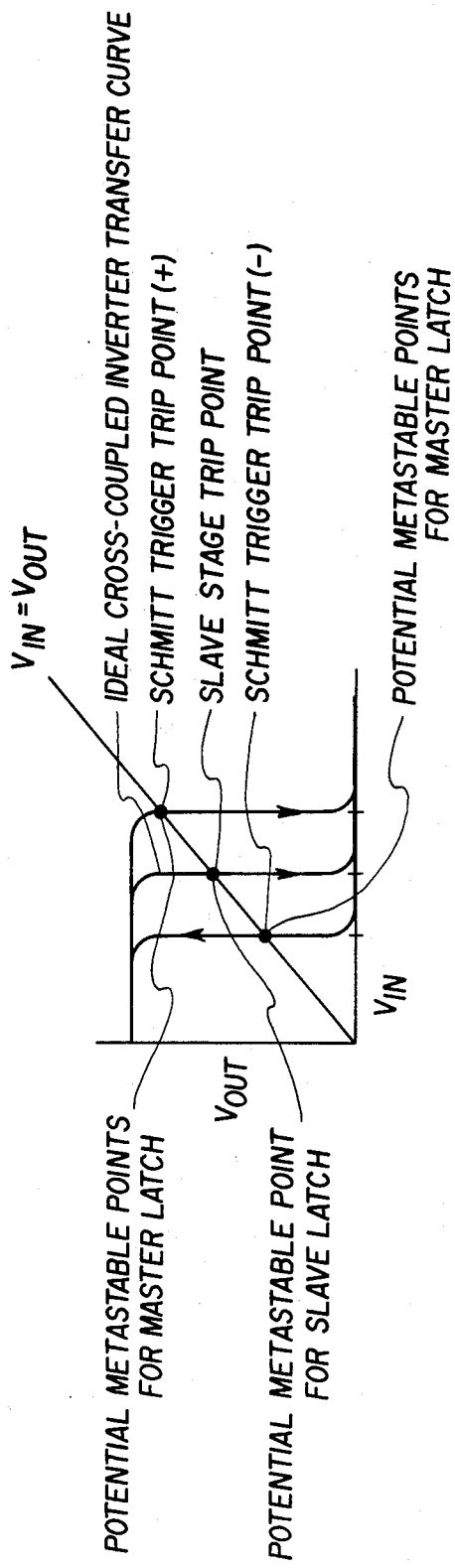
FIG. 4 is a graph illustrating the transfer curves of the two-stage synchronizer circuit shown in FIG. 3.

Referring to FIG. 4, the Schmitt trigger 18 forces the input trip level of the master stage to be one of two values depending on which logic direction the input data signal is coming from. These trip levels also coincide with the potential metastable points of the master stage. Thus, as shown in FIG. 4, the master stage latch has two potentially metastable points which are located on either side of the transfer curve of the cross-coupled inverter 24 of the slave stage.

As stated above, the slave, cross-coupled inverter stage has a trip point positioned half way in terms of $V_{in}$ between the Schmitt trigger trip points. Thus, the area where the slave stage will go into metastable operation is precisely the non-metastable region of the master stage. Similarly, the area where the master stage will go into metastable operation is precisely the non-metastable region of the slave stage. This means that during the resolution phase of the synchronizer (1) metastable conditions in the master and slave stages are not co-existent and (2) metastability in either the master or the slave stage will be resolved by the opposite stage in a finite amount of time. Thus, this configuration achieves a finite metastable time, resulting in a predictable minimum clock period that minimizes asynchronous data transfer anomalies.

In other words, during metastability the transfer function of the master stage latch will essentially take on the characteristics of the Schmitt trigger 18; for a given $V_{in}=V_{out}$, there exist two potential metastable points. On the other hand, the slave stage latch will provide only one metastable solution for a given $V_{in}=V_{out}$. Since the potential metastable points of the master stage latch do not equal the potential metastable points of the slave stage latch, the solutions for the two stages will never match. Thus, the two latches will resolve each other in an active way via the feedforward/back path between the master and slave stages.

As shown in FIG. 4, when either the master or slave latch is in the metastable region, it requires very little to influence it because it is in the high gain region, i.e. a small change in $V_{in}$ provides a relatively large change in $V_{out}$. Thus, providing a small, finite amount of drive can resolve the metastable condition in either the master or the slave stages.

Thus, in accordance with the present invention, the synchronizer circuit 10 provides a shared data, feedforward/back path which resolves the metastable state between the master/slave flip-flop stages.

The characteristics of the devices utilized to implement the Schmitt trigger 18 and the feedback inverter 24 should be such that the Schmitt trigger 1B is able to dominate the inverter 24. That is, the w/L ratio of the devices utilized in the Schmitt trigger 18 and inverter 22 should be high in comparison to the w/L ratio of devices utilized in inverters 20 and 24. However, the stronger the characteristics of inverter 24, the faster the slave stage will be able to provide the feedback drive necessary to resolve the metastable condition of the master stage.

It should be understood that various alternatives to the structure as described herein may be employed in practicing the present invention. It is intended that the following claims define the invention and that the structure within the scope of these claims and their equivalents be covered thereby.

What is claimed is:

1. A finite metastable time synchronizer for synchronizing an input data signal provided to a digital receiving circuit with a clock frequency of the receiving circuit, the synchronizer comprising;
   a master stage which receives the input data signal and is capable of providing two potential metastable points; and
   a slave stage capable of providing one potential metastable point and coupled to receive a master stage output via a data path which also serves as a feedforward/back path between the slave stage and the master stage to provide resolution of metastable conditions in the synchronizer.

2. A synchronizer as in claim 1 wherein the master stage comprises a Schmitt trigger and a cross-coupled inverter, such that the output of the Schmitt trigger is the input of the cross-coupled inverter.

3. A synchronizer as in claim 2 wherein the slave stage comprises a buffer inverter and a second cross-coupled inverter, such that the output of the buffer inverter is the input of the second cross-coupled inverter.

4. A synchronizer as in claim 3 wherein the w/L ratios of the transistors utilized in the Schmitt trigger are such that the Schmitt trigger dominates the second cross-coupled inverter.

5. A finite metastable time synchronizer for synchronizing an input data signal provided to a digital receiving circuit with a clock frequency of the receiving circuit, the synchronizer comprising:
   a. a first logic gate for receiving a data signal which is asynchronous to a clock signal and for providing an output signal upon receipt of the clock signal;
   b. a first stage which receives the output signal from the first logic gate and is capable of providing two potential metastable points;
   c. a second logic gate coupled to provide a data, feedforward/back path between the first stage and a second stage in response to the clock signal compliment; and
   d. a second stage coupled to receive a first stage output via the data path which also serves as a feedforward/back path between the second stage and the first stage to provide resolution of metastable conditions in the synchronizer.

* * * * *